(12) United States Patent
Tsuda (10) Patent No.: US 12,407,146 B2
(45) Date of Patent: Sep. 2, 2025

(54) VERTICAL CAVITY LIGHT-EMITTING ELEMENT AND MANUFACTURING METHOD OF THE SAME

(71) Applicant: Stanley Electric Co., Ltd., Tokyo (JP)

(72) Inventor: Yuhzoh Tsuda, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 680 days.

(21) Appl. No.: 17/832,688

(22) Filed: Jun. 6, 2022

(65) Prior Publication Data
US 2022/0393436 A1    Dec. 8, 2022

(30) Foreign Application Priority Data
Jun. 7, 2021    (JP) .................................. 2021-94869

(51) Int. Cl.
*H01S 5/183*    (2006.01)
*H01S 5/042*    (2006.01)
(Continued)

(52) U.S. Cl.
CPC ...... *H01S 5/18377* (2013.01); *H01S 5/04257* (2019.08); *H01S 5/18341* (2013.01);
(Continued)

(58) Field of Classification Search
CPC ............. H01S 5/18377; H01S 5/04257; H01S 5/18341; H01S 5/18369; H01S 5/2275; H01S 5/3211; H01S 5/34333
See application file for complete search history.

(56) References Cited

U.S. PATENT DOCUMENTS 5,835,521 A    11/1998  Ramdani et al.
6,121,068 A *  9/2000   Ramdani ............... H01S 5/1838
                                                   438/39
(Continued)

FOREIGN PATENT DOCUMENTS

JP    3763737 B2       4/2006
JP    2007-250736 A    9/2007
JP    2009-004602 A    1/2009

OTHER PUBLICATIONS

Office Action issued on Jan. 28, 2025, in corresponding Japanese patent Application No. 2021-094869, 11 pages.

*Primary Examiner* — Yuanda Zhang
(74) *Attorney, Agent, or Firm* — XSENSUS LLP (57) ABSTRACT

A vertical cavity light-emitting element includes a substrate, a first multilayer film reflecting mirror, a semiconductor structure layer, an electrode, an electrode layer, and a second multilayer film reflecting mirror. The first multilayer film reflecting mirror is formed on the substrate. The semiconductor structure layer includes a nitride semiconductor. The nitride semiconductor includes a first semiconductor layer that is formed on the first multilayer film reflecting mirror and is a first conductivity type, a second semiconductor layer that is formed on the first semiconductor layer and is the first conductivity type, a light-emitting layer that is formed on the second semiconductor layer and is configured to expose a region including an outer edge of a top surface of the second semiconductor layer, and a third semiconductor layer that is formed on the light-emitting layer and is a second conductivity type opposite to the first conductivity type. The electrode is formed on the top surface of the second semiconductor layer. The electrode layer is electrically in contact with the third semiconductor layer in one region of a top surface of the third semiconductor layer. The second multilayer film reflecting mirror constitutes a resonator with the (Continued)

first multilayer film reflecting mirror. The second semiconductor layer has a larger resistance than the first semiconductor layer.

9 Claims, 9 Drawing Sheets

(51) Int. Cl.
    *H01S 5/227*         (2006.01)
    *H01S 5/32*           (2006.01)
    *H01S 5/343*         (2006.01)

(52) U.S. Cl.
    CPC ........ *H01S 5/18369* (2013.01); *H01S 5/2275* (2013.01); *H01S 5/3211* (2013.01); *H01S 5/34333* (2013.01)

(56) References Cited

U.S. PATENT DOCUMENTS

| | | | | |
|---|---|---|---|---|
| 6,455,340 | B1* | 9/2002 | Chua | H10H 20/862 |
| | | | | 438/31 |
| 2009/0147814 | A1* | 6/2009 | Hosoi | H01S 5/223 |
| | | | | 257/E21.532 |
| 2020/0111929 | A1* | 4/2020 | Koyama | H10F 30/21 |
| 2020/0274328 | A1 | 8/2020 | Park et al. | |

* cited by examiner

VERTICAL CAVITY LIGHT-EMITTING ELEMENT AND MANUFACTURING METHOD OF THE SAME

BACKGROUND OF THE INVENTION

1. Field of the Invention

The present invention relates to a vertical cavity light-emitting element and a manufacturing method of the same.

2. Background Art

As a vertical cavity light-emitting element, for example, Japanese Patent No. 3763737 (JP-B2-2006-3763737) discloses a Vertical Cavity Surface Emitting Laser (VCSEL) that includes a semiconductor layer and two multilayer film reflecting mirrors mutually opposed across the semiconductor layer.

SUMMARY OF THE INVENTION

In the VCSEL as disclosed in Japanese Patent No. 3763737 (JP-B2-2006-3763737), it is one of the problems to flow a current flowing into the VCSEL to a region contributing to a gain of a laser beam in an active layer as much as possible, thus reducing a threshold current necessary for oscillating the laser beam as much as possible. It is also one of the problems to avoid an element breakdown due to an excessive current concentration in the semiconductor layer.

The present invention has been made in consideration of the problems described above, and an object of the present invention is to provide a vertical cavity light-emitting element in which a threshold current is low and an element breakdown is less likely to occur, and a manufacturing method of the same.

A vertical cavity light-emitting element according to the present invention includes a substrate, a first multilayer film reflecting mirror, a semiconductor structure layer, an electrode, an electrode layer, and a second multilayer film reflecting mirror. The first multilayer film reflecting mirror is formed on the substrate. The semiconductor structure layer includes a nitride semiconductor. The nitride semiconductor includes a first semiconductor layer that is formed on the first multilayer film reflecting mirror and is a first conductivity type, a second semiconductor layer that is formed on the first semiconductor layer and is the first conductivity type, a light-emitting layer that is formed on the second semiconductor layer and is configured to expose a region including an outer edge of a top surface of the second semiconductor layer, and a third semiconductor layer that is formed on the light-emitting layer and is a second conductivity type opposite to the first conductivity type. The electrode is formed on the top surface of the second semiconductor layer. The electrode layer is electrically in contact with the third semiconductor layer in one region of a top surface of the third semiconductor layer. The second multilayer film reflecting mirror constitutes a resonator with the first multilayer film reflecting mirror. The second semiconductor layer has a larger resistance than the first semiconductor layer.

A manufacturing method of a vertical cavity light-emitting element according to the present invention includes: a first multilayer film reflecting mirror forming step of forming a first multilayer film reflecting mirror on a substrate; a semiconductor layer stacking step of stacking a GaN layer of a first conductivity type, an AlGaN layer of the first conductivity type, a light-emitting layer, and a nitride semiconductor layer of a second conductivity type opposite to the first conductivity type on the first multilayer film reflecting mirror in this order; an etching process step of forming a mask in one region of a top surface of the nitride semiconductor layer and exposing a region including an outer edge of a top surface of the AlGaN layer by performing an etching process on another region excluding the one region of the top surface by a dry etching method while measuring an intensity of a reflected light when the other region is irradiated with a laser beam, the etching process step stopping the etching process based on a change of the intensity of the reflected light; an electrode forming step of forming an electrode on the top surface of the AlGaN layer; an electrode layer forming step of forming an electrode layer electrically in contact with the nitride semiconductor layer in the one region of the top surface of the nitride semiconductor layer; and a second multilayer film reflecting mirror forming step of forming a second multilayer film reflecting mirror constituting a resonator with the first multilayer film reflecting mirror.

DETAILED DESCRIPTION OF THE INVENTION

The following describes embodiments of the present invention in detail with reference to the drawings.

Embodiment 1

Figure 1:
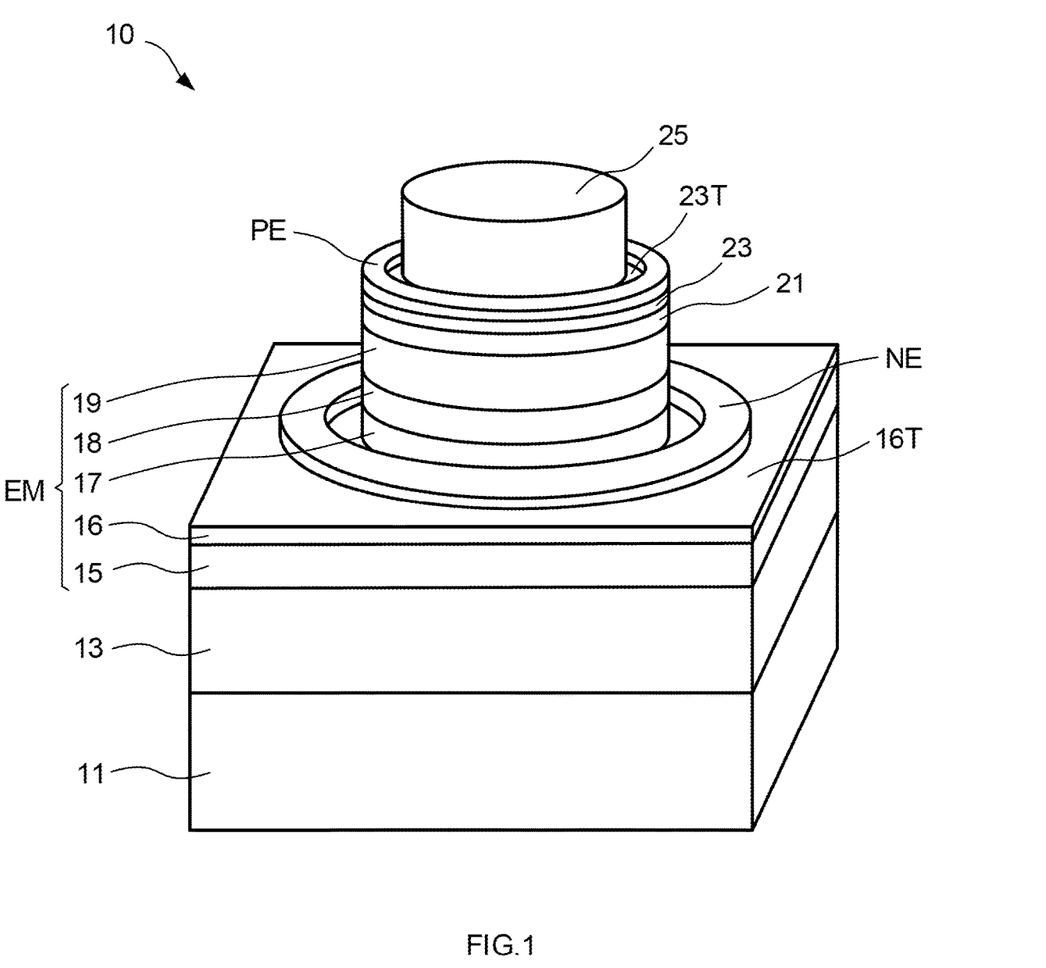
FIG. 1 is a perspective view of a vertical cavity surface emitting laser according to Embodiment 1.

FIG. 1 is a perspective view of a vertical cavity surface emitting laser (hereinafter simply referred to as a surface emitting laser) 10 according to Embodiment 1.

A substrate 11 is a flat plate-shaped substrate having a rectangular top surface shape. In the drawings of this application, as an example, a case where the substrate 11 has a square top surface shape is illustrated. The substrate 11 is a growth substrate that allows a growth of a semiconductor crystal on the top surface. In this embodiment, the substrate 11 contains gallium nitride (GaN).

A first multilayer film reflecting mirror 13 is a semiconductor multilayer film reflecting mirror in which a low refractive-index semiconductor film and a high refractive-index semiconductor film having a higher refractive index than the low refractive-index semiconductor film are alternately stacked on the substrate 11. The first multilayer film reflecting mirror 13 is formed so as to cover the top surface of the substrate 11. Therefore, the first multilayer film reflecting mirror 13 has a top surface shape the same as the top surface shape of the substrate 11, that is, a rectangular top surface shape. In this embodiment, the first multilayer film reflecting mirror 13 is what is called a Distributed Bragg Reflector (DBR) containing a semiconductor material.

In this embodiment, the first multilayer film reflecting mirror 13 is formed by alternately stacking the low refractive-index semiconductor film having a composition of aluminum indium nitride (AlInN) and the high refractive-index semiconductor film having a composition of GaN. For example, a buffer layer (not illustrated) having a composition of GaN is disposed on the top surface of the substrate 11, and the high refractive-index semiconductor film and the low refractive-index semiconductor film described above are alternately formed on the buffer layer, thereby forming the first multilayer film reflecting mirror 13.

A semiconductor structure layer E M is a stacked structure including a plurality of semiconductor layers formed on the first multilayer film reflecting mirror 13. In this embodiment, the semiconductor structure layer EM includes a first semiconductor layer 15, a second semiconductor layer 16, a third semiconductor layer 17, an active layer 18, and a fourth semiconductor layer 19.

The first semiconductor layer 15 is a nitride semiconductor layer that is formed on the first multilayer film reflecting mirror 13 and is an n-type as a first conductivity type. The first semiconductor layer 15 is formed so as to cover the top surface of the first multilayer film reflecting mirror 13. Therefore, the first semiconductor layer 15 has a top surface shape the same as the top surface shape of the first multilayer film reflecting mirror 13, that is, a rectangular top surface shape. In this embodiment, the first semiconductor layer 15 has a composition of GaN, and doped with silicon (Si) as n-type impurities.

The second semiconductor layer 16 is a nitride semiconductor layer that is formed on the first semiconductor layer 15 and is the n-type. The second semiconductor layer 16 is formed so as to cover the top surface of the first semiconductor layer 15. Therefore, the second semiconductor layer 16 has a top surface shape the same as the top surface shape of the first semiconductor layer 15, that is, a rectangular top surface shape.

In this embodiment, the second semiconductor layer 16 has a composition of aluminum gallium nitride (AlGaN), and doped with Si as n-type impurities. The second semiconductor layer 16 has a larger band gap energy than the first semiconductor layer 15 because of its composition.

In this embodiment, the second semiconductor layer 16 is formed to have a thinner layer thickness than the first semiconductor layer 15. Specifically, in this embodiment, the layer thickness of the first semiconductor layer 15 is 1400 nm, and the layer thickness of the second semiconductor layer 16 is 10 nm.

The second semiconductor layer 16 is configured to have a higher resistance than the first semiconductor layer 15. In the surface emitting laser 10, the second semiconductor layer 16 is formed to have a higher resistance value of a material and the thinner layer thickness than the first semiconductor layer 15. Accordingly, the second semiconductor layer 16 has a higher sheet resistance than the first semiconductor layer 15.

The third semiconductor layer 17 is a nitride semiconductor layer that is formed in the approximately center of a top surface 16T of the second semiconductor layer 16 and is the n-type. The third semiconductor layer 17 has a circular top surface shape, and is formed to be configured to expose a region including an outer edge of the top surface 16T of the second semiconductor layer 16. In this embodiment, the third semiconductor layer 17 has a composition of GaN, and doped with Si as n-type impurities.

The active layer 18 is a semiconductor layer formed so as to cover the top surface of the third semiconductor layer 17. Therefore, the active layer 18 has a top surface shape the same as the top surface shape of the third semiconductor layer 17, that is, a circular top surface shape.

In this embodiment, the active layer 18 has a quantum well structure including a well layer having a composition of indium gallium nitride (InGaN) and a barrier layer having a composition of GaN. The active layer 18 is a layer configured to generate a light by recombination of the electrons and the holes in the active layer 18. In other words, the active layer 18 is a light-emitting layer that emits a light from the active layer 18.

The fourth semiconductor layer 19 is a nitride semiconductor layer that is formed on the active layer 18 and is a p-type as a second conductivity type. The fourth semiconductor layer 19 is formed so as to cover the top surface of the active layer 18. Therefore, the fourth semiconductor layer 19 has a top surface shape the same as the top surface shape of the active layer 18, that is, a circular top surface shape. In this embodiment, the fourth semiconductor layer 19 has a composition of GaN, and doped with magnesium (Mg) as p-type impurities.

In this embodiment, a p-type AlGaN layer (not illustrated) as a carrier block layer is formed between the active layer 18 and the fourth semiconductor layer 19, and a p-type GaN layer (not illustrated) as a contact layer is formed on the fourth semiconductor layer 19.

In this embodiment, in the semiconductor structure layer EM, the third semiconductor layer 17, the active layer 18, and the fourth semiconductor layer 19 are stacked in this order on the top surface 16T of the second semiconductor layer 16, thereby forming a columnar portion extending upward from the top surface 16T of the second semiconductor layer 16. In other words, the semiconductor structure layer EM has a mesa-shaped structure (hereinafter also referred to as a mesa structure) including the third semiconductor layer 17 projecting from the top surface 16T of the second semiconductor layer 16, and the active layer 18 and the fourth semiconductor layer 19 are stacked on the mesa structure.

An n-electrode NE is an annular metal electrode that is formed on the top surface 16T of the second semiconductor layer 16 and electrically connected to the second semiconductor layer 16. The n-electrode NE is formed so as to surround the third semiconductor layer 17 and to be spaced from the third semiconductor layer 17 on the top surface 16T of the second semiconductor layer 16. In this embodiment, the n-electrode NE is formed of titanium (Ti) and aluminum (Al) in this order on the top surface 16T of the second semiconductor layer 16.

An insulating layer 21 is a translucent insulating layer including an insulator formed on the fourth semiconductor layer 19. The insulating layer 21 is provided with a circular opening (not illustrated in FIG. 1) that exposes the fourth semiconductor layer 19 in the center of the insulating layer 21. In this embodiment, the insulating layer 21 contains silicon dioxide ($SiO_2$).

A translucent electrode layer 23 is a conductive film that is formed on the insulating layer 21 so as to cover the above-described opening and has a translucency. The translucent electrode layer 23 has a circular top surface shape. In this embodiment, the translucent electrode layer 23 contains indium tin oxide (ITO).

A p-electrode PE is an annular metal electrode that is formed along an outer edge of a top surface 23T of the translucent electrode layer 23 and electrically connected to the translucent electrode layer 23. In this embodiment, the p-electrode PE contains gold (Au).

A second multilayer film reflecting mirror 25 is a dielectric multilayer film reflecting mirror in which a low refractive-index dielectric film and a high refractive-index dielectric film having a higher refractive index than the low refractive-index dielectric film are alternately stacked on the top surface 23T of the translucent electrode layer 23. The second multilayer film reflecting mirror 25 has a circular top surface shape smaller than the top surface of the translucent electrode layer 23.

In this embodiment, the second multilayer film reflecting mirror 25 is what is called a Distributed Bragg Reflector (DBR) containing a dielectric material. The second multilayer film reflecting mirror 25 is formed to be spaced from the p-electrode PE.

In this embodiment, the second multilayer film reflecting mirror 25 is formed by alternately stacking the low refractive-index dielectric film containing $SiO_2$ and the high refractive-index dielectric film containing niobium oxide ($Nb_2O_5$). For the second multilayer film reflecting mirror 25, tantalum pentoxide ($Ta_2O_5$) may be used as the low refractive-index dielectric film, and $Al_2O_3$ may be used as the high refractive-index dielectric film.

In this embodiment, the first multilayer film reflecting mirror 13 and the second multilayer film reflecting mirror 25 are disposed so as to interpose the semiconductor structure layer EM therebetween in an up-down direction in the drawing, and configured as a resonator to oscillate a light emitted from the active layer 18 of the semiconductor structure layer EM.

In the surface emitting laser 10, when a voltage is applied between the n-electrode NE and the p-electrode PE, a current flows in the active layer 18 via a current confinement layer, and when a value of the current reaches a specific current value at which an intensity of an output light rapidly increases, that is, a threshold current, a light of stimulated emission is emitted from the active layer 18. The light emitted from the active layer 18 is repeatedly reflected between the first multilayer film reflecting mirror 13 and the second multilayer film reflecting mirror 25, thus reaching a resonant state (laser oscillation).

In this embodiment, the first multilayer film reflecting mirror 13 has a reflectance slightly lower than that of the second multilayer film reflecting mirror 25. Therefore, the light resonated between the first multilayer film reflecting mirror 13 and the second multilayer film reflecting mirror 25 is partially transmitted through the first multilayer film reflecting mirror 13 and the substrate 11, and extracted outside. That is, the light resonated between the first multilayer film reflecting mirror 13 and the second multilayer film reflecting mirror 25 is emitted downward in the drawing In this embodiment, an anti-reflection film (not illustrated) in which $Nb_2O_5$ and $SiO_2$ are stacked is formed on a lower surface of the substrate 11. The anti-reflection film is what is called an AR coating that suppresses the reflection of the light emitted from the substrate 11 by the lower surface of the substrate 11.

Figure 2:
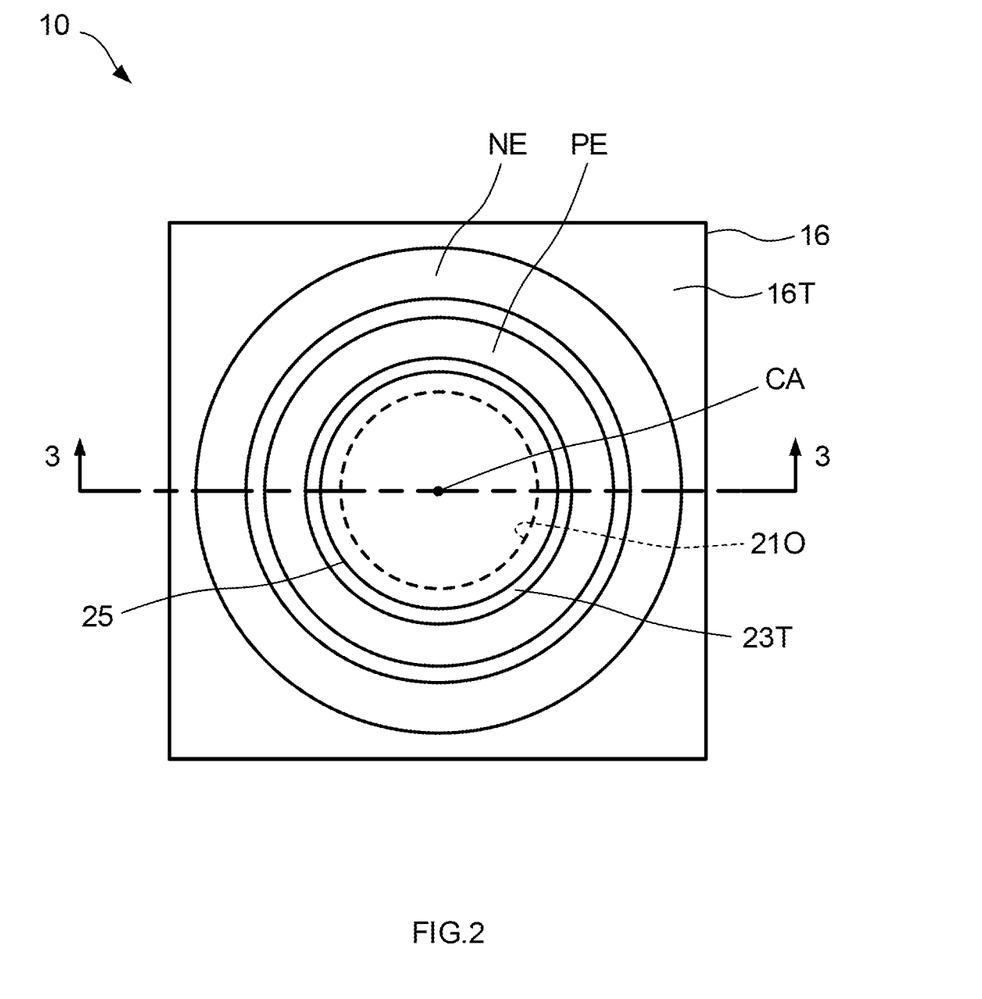
FIG. 2 is a top view of the vertical cavity surface emitting laser according to Embodiment 1.

FIG. 2 is a top view of the surface emitting laser 10. In FIG. 2, an axis passing through the center of the surface emitting laser 10 in top view in a depth direction of the drawing is illustrated as a central axis CA. In this embodiment, the central axis CA corresponds to an optical axis of a laser beam emitted from the surface emitting laser 10.

As described above, the surface emitting laser 10 includes the semiconductor structure layer EM including the first semiconductor layer 15 and the second semiconductor layer 16 having the rectangular top surface shapes, and the third semiconductor layer 17, the active layer 18, and the fourth semiconductor layer 19 that are formed on the top surface 16T of the second semiconductor layer 16 and have the circular top surface shapes.

As described above, the surface emitting laser 10 includes the insulating layer 21 formed on the fourth semiconductor layer 19, the translucent electrode layer 23 formed on the insulating layer 21, and the second multilayer film reflecting mirror 25 formed on the top surface 23T of the translucent electrode layer 23.

As described above, the insulating layer 21 is provided with a circular opening 210 that exposes the fourth semiconductor layer 19 in the center of the insulating layer 21. In other words, the insulating layer 21 is an annular insulating layer formed on the fourth semiconductor layer 19. As illustrated in FIG. 2, the opening 210 is covered with the second multilayer film reflecting mirror 25 in top view.

As described above, the surface emitting laser 10 includes the n-electrode NE formed on the top surface 16T of the second semiconductor layer 16 and the p-electrode PE formed on the top surface 23T of the translucent electrode layer 23. In top view, the n-electrode NE and the p-electrode PE have annular shapes that are mutually concentric circles with respect to the central axis CA, and the n-electrode NE is configured to have a larger diameter than the p-electrode PE.

Figure 3:
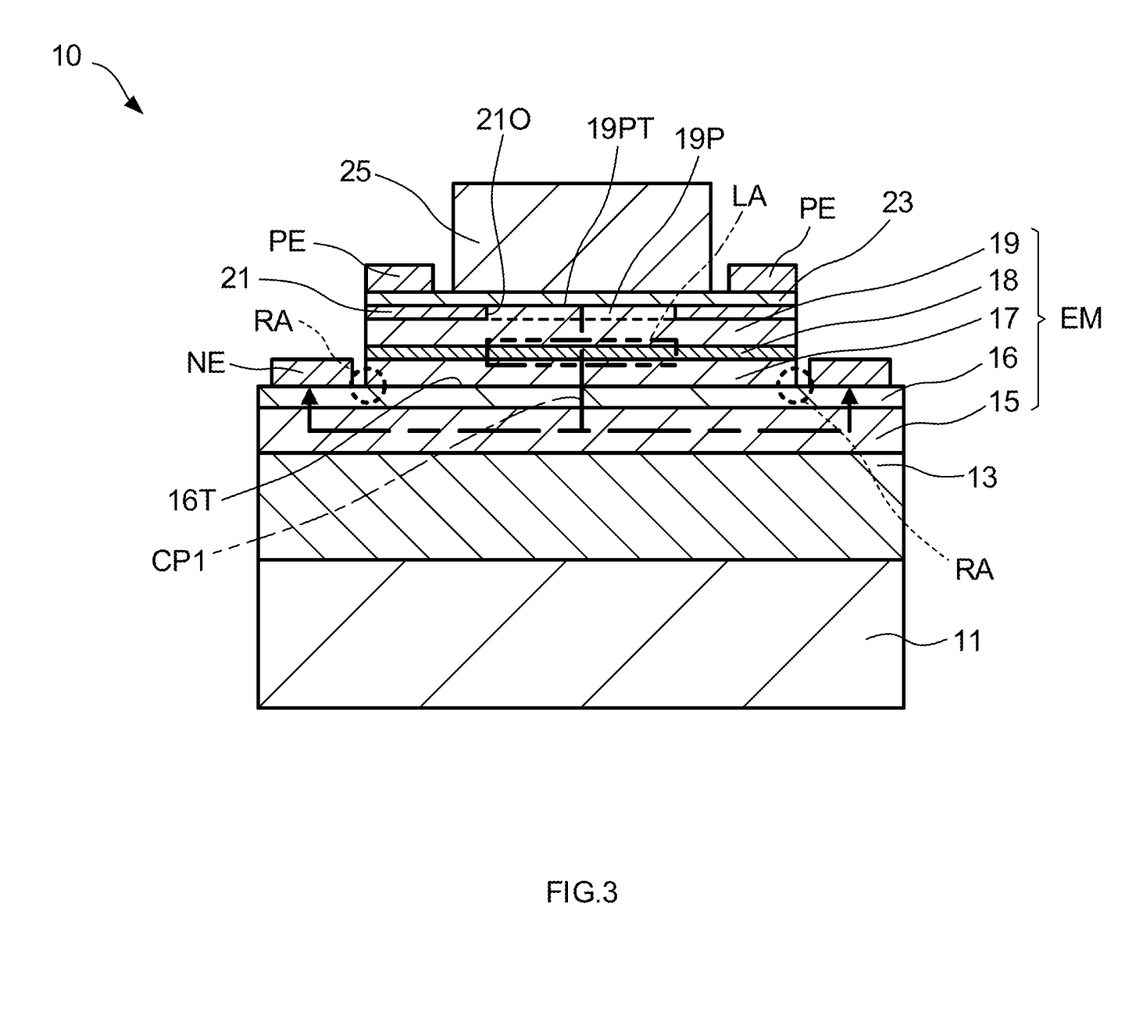
FIG. 3 is a cross-sectional view of the vertical cavity surface emitting laser according to Embodiment 1.

FIG. 3 is a cross-sectional view taken along a line 3-3 of the surface emitting laser 10 in FIG. 2. As described above, the surface emitting laser 10 includes the first multilayer film reflecting mirror 13 formed on the substrate 11, the semiconductor structure layer EM formed on the first multilayer film reflecting mirror 13, and the second multilayer film reflecting mirror 25 constituting a resonator with the first multilayer film reflecting mirror 13 while interposing the semiconductor structure layer EM therebetween.

In this embodiment, the fourth semiconductor layer 19 includes a projecting portion 19P that projects from the center of the fourth semiconductor layer 19 and has a circular top surface shape. For the projecting portion 19P, a top surface 19PT of the projecting portion 19P is in contact with the lower surface of the translucent electrode layer 23.

The insulating layer 21 is provided with the opening 210 that exposes the top surface of the projecting portion 19P in the top surface of the fourth semiconductor layer 19. In other words, the insulating layer 21 is formed in an annular shape so as to surround the projecting portion 19P. In this embodiment, the layer thickness of the insulating layer 21 is approximately the same as the layer thickness of the projecting portion 19P.

The translucent electrode layer 23 is formed so as to cover the top surface of the insulating layer 21 and the top surface of the projecting portion 19P exposed from the opening 210 of the insulating layer 21. That is, the translucent electrode layer 23 is electrically in contact with the fourth semiconductor layer 19 via the top surface 19PT of the projecting portion 19P. In other words, the translucent electrode layer 23 is electrically insulated from the fourth semiconductor layer 19 in a region not in contact with the top surface of the projecting portion 19P.

In this embodiment, the insulating layer 21 surrounding the projecting portion 19P of the fourth semiconductor layer 19 is what is called a current confinement layer that restricts a range of current supply to the active layer 18. That is, the current flowed from the p-electrode PE to the translucent electrode layer 23 flows in the active layer 18 via the top surface 19PT of the projecting portion 19P electrically in contact with the translucent electrode layer 23.

[Path of Current Flowing in Semiconductor Structure Layer]

The following describes a path of the current flowing in the semiconductor structure layer EM in detail with reference to FIG. 3.

In the surface emitting laser 10, as described above, the second semiconductor layer 16 is formed to have the higher resistance value of the material and the thinner layer thickness than the first semiconductor layer 15. Accordingly, the second semiconductor layer 16 has the higher sheet resistance than the first semiconductor layer 15.

According to this embodiment, with the above-described configuration of the surface emitting laser 10, the current that has reached the top surface 19PT of the projecting portion 19P of the fourth semiconductor layer 19 from the p-electrode PE via the translucent electrode layer 23 flows in the first semiconductor layer 15 passing through a shortest path from the top surface 19PT to the first semiconductor layer 15, and flows to the n-electrode NE.

Specifically, the current that has reached the top surface 19PT of the projecting portion 19P flows through each of the fourth semiconductor layer 19, the active layer 18, the third semiconductor layer 17, and the second semiconductor layer 16 in the thickness direction, and flows to the first semiconductor layer 15. The current that has reached the first semiconductor layer 15 is dispersed in an in-plane direction in the first semiconductor layer 15, and flows to the n-electrode NE.

In other words, in the flow of the current flowing in the semiconductor structure layer EM, a vector in a longitudinal direction is dominant in the fourth semiconductor layer 19, the active layer 18, the third semiconductor layer 17, and the second semiconductor layer 16, and a vector in a lateral direction is dominant in the first semiconductor layer 15. Accordingly, the current flowing in from the top surface 19PT flows mainly immediately downward from the top surface 19PT until reaching the first semiconductor layer 15, and flows in the lateral direction after entering the first semiconductor layer 15.

For example, as illustrated as a current path CP1 in FIG. 3, the current that has reached the top surface 19PT of the projecting portion 19P from the p-electrode PE flows to the first semiconductor layer 15 passing through mainly the central region of each of the fourth semiconductor layer 19, the active layer 18, the third semiconductor layer 17, and the second semiconductor layer 16.

This embodiment allows avoiding the concentration of the current from the top surface 19PT to a region RA (regions indicated by dashed lines in the drawing) that is a region adjacent to a rising portion of the mesa structure at the lower end of the third semiconductor layer 17. Therefore, this embodiment allows avoiding an element breakdown and the like caused by the current concentration to the region RA.

In this embodiment, the current flowing from the top surface 19PT flows a region LA (region indicated by a two-dot chain line in the drawing) immediately below the projecting portion 19P of the fourth semiconductor layer 19 in the active layer 18 in the thickness direction. The region LA is a region in which the injected current (carrier) contributes to a gain of a laser beam.

Therefore, this embodiment allows avoiding a flow of the current to, for example, a region not contributing to the gain of the laser beam around the region LA, that is, a region in which an optical loss occurs. Therefore, since this embodiment allows avoiding the unnecessary flow of the current to the region in which an optical loss occurs, a threshold current necessary for oscillating the laser beam can be reduced.

As described above, according to this embodiment, the element breakdown caused by the current concentration to the region RA and the like can be avoided, and the threshold current necessary for oscillating the laser beam can be reduced.

Here, the following describes specific configurations of the respective layers in the semiconductor structure layer EM in the surface emitting laser 10, which are preferable for producing the current flow that provides the effect of avoiding the element breakdown or the effect of reducing the threshold current as described above.

In this embodiment, to provide the path in which the current flows in the in-plane direction in the first semiconductor layer 15, the first semiconductor layer 15 preferably has the layer thickness ten times or more of that of the second semiconductor layer 16. Specifically, the first semiconductor layer 15 preferably has the layer thickness of 500 nm or more and 1600 nm or less.

In this embodiment, the second semiconductor layer 16 preferably has the layer thickness of 7 nm or more and 20 nm or less. This is because the layer thickness of less than 7 nm of the second semiconductor layer 16 decreases the distance between the third semiconductor layer 17 and the first semiconductor layer 15, and it becomes difficult to avoid the current concentration to the region RA. Additionally, this is because the layer thickness exceeding 20 nm of the second semiconductor layer 16 possibly causes the increase of the voltage applied to the element.

In this embodiment, the first semiconductor layer 15 containing GaN is preferably doped with Si having the concentration of from $2 \times 10^{18}$ to $5 \times 10^{18}$ atoms/cm$^3$ as an n-type dopant. This is because the Si concentration of less than $2 \times 10^{18}$ atoms/cm$^3$ causes the current to be less likely to flow into the first semiconductor layer 15, and the Si concentration exceeding $5 \times 10^{18}$ atoms/cm$^3$ possibly increases an internal loss of the light due to a light absorption.

In this embodiment, the second semiconductor layer 16 containing AlGaN preferably has the Al content of 8% or more and 35% or less. This is because the Al content of less than 8% makes the current concentration to the region RA difficult to be avoided, and the Al content exceeding 35% increases a contact resistance between the second semiconductor layer 16 and the n-electrode NE formed on the top surface 16T of the second semiconductor layer 16.

In this embodiment, the second semiconductor layer 16 containing AlGaN is preferably doped with Si having the concentration of from $3 \times 10^{18}$ to $8 \times 10^{19}$ atoms/cm$^3$ as an n-type dopant. This is because the Si concentration of less than $3 \times 10^{18}$ atoms/cm$^3$ increases a contact resistance between the n-electrode NE formed on the top surface 16T of the second semiconductor layer 16 and the second semiconductor layer 16, and the Si concentration exceeding $8 \times 10^{19}$ atoms/cm$^3$ possibly deteriorates a crystallinity as the AlGaN layer.

In this embodiment, to reduce the internal loss of the light due to the laser beam absorption, the second semiconductor layer 16 is preferably formed at a position of a portion at which an optical electric field intensity decreases in the resonator, that is, a node part of the optical electric field distribution. The active layer 18 is preferably formed to have the center in the thickness direction at an antinode part of the optical electric field distribution.

Specifically, the second semiconductor layer 16 is preferably formed such that the center in the thickness direction of the second semiconductor layer 16 is positioned at a position of a distance a from the center in the thickness direction of the active layer 18. Here, the distance a can be expressed as $a=(2m+1) \times 0.25 \lambda/n$, and m is any given integer, $\lambda$ is an oscillation wavelength of the laser beam, and n is a GaN refractive index at the oscillation wavelength.

While the fourth semiconductor layer 19 as the contact layer is a p-type GaN layer in this embodiment, the fourth semiconductor layer 19 may be a p-type InGaN layer.

[Manufacturing Method of Surface Emitting Laser]

Figure 4:
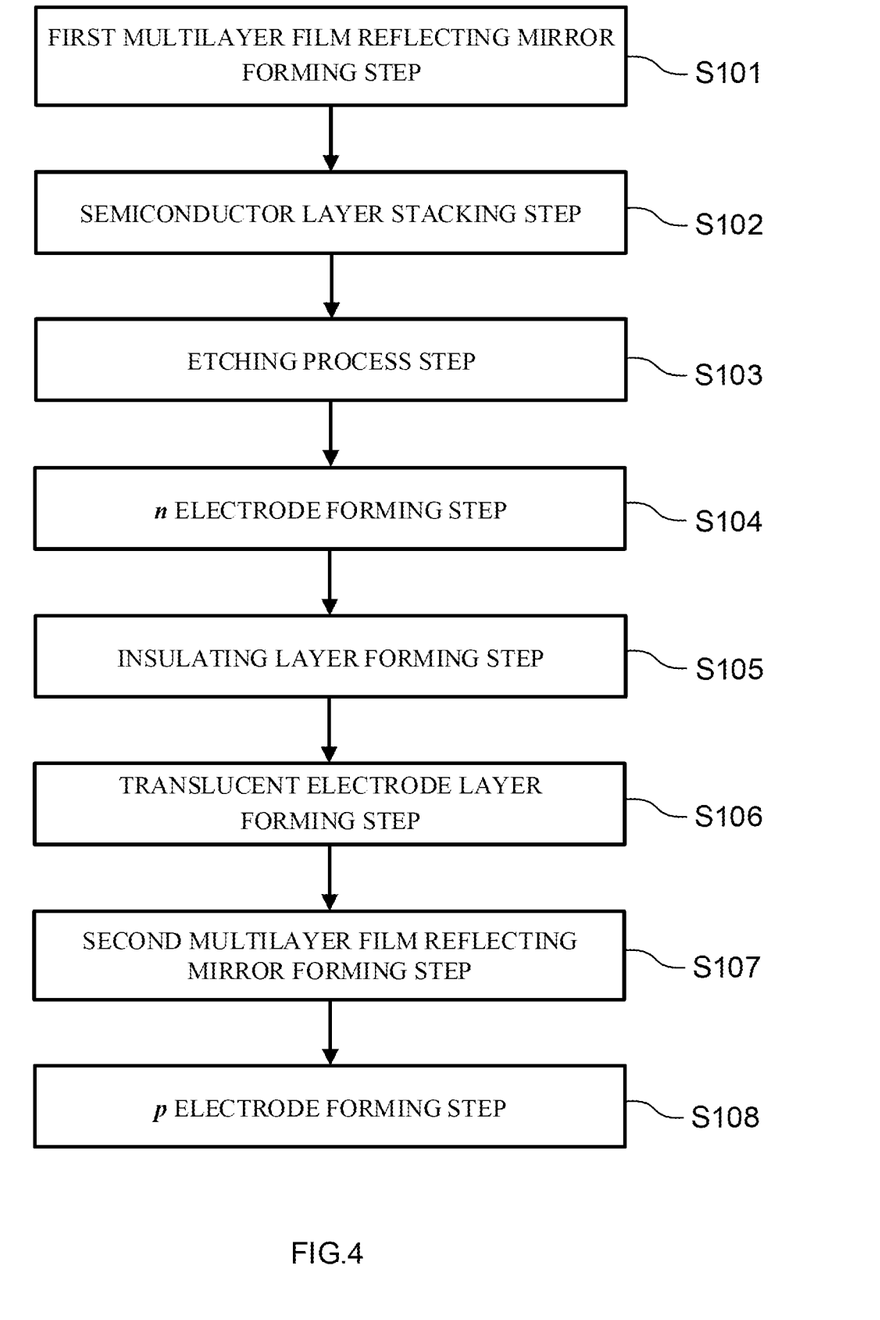
FIG. 4 is a flowchart of a manufacturing method of the vertical cavity surface emitting laser according to Embodiment 1.

The following describes the manufacturing method of the surface emitting laser 10 with reference to FIG. 4. FIG. 4 is a flowchart illustrating an exemplary manufacturing process of the surface emitting laser 10. In this embodiment, formations of the respective semiconductor layers in the semiconductor structure layer EM are performed by using a method of Metal Organic Chemical Vapor Deposition (MOCVD).

First, as a step of forming the first multilayer film reflecting mirror 13, trimethylaluminum (TMA) and trimethyl indium (TMIn), which are group III raw materials, and an ammonia gas are introduced on the substrate 11 containing GaN to form AlInN in MOCVD equipment. Subsequently, trimethylgallium (TMGa) as a group III raw material is introduced instead of TMA and TMIn, thus forming GaN. This process is repeatedly performed 41 times, thus forming the first multilayer film reflecting mirror 13 containing 41 sets of AlInN/GaN (Step S101).

At this time, AlInN and GaN are formed in layers on a (0001) plane of a crystal face of the substrate 11, and formed so as to have the respective layer thicknesses of ¼ of an optical layer thickness relative to a desired wavelength.

Next, as a semiconductor layer stacking step, the first semiconductor layer 15 as a first n-type GaN layer, the second semiconductor layer 16 as an n-type AlGaN layer, a second n-type GaN layer, an active layer, and a p-type GaN layer are stacked on the first multilayer film reflecting mirror 13 in this order (Step S102).

As a specific stacking process, first, a doping gas SiH$_4$ containing TMGa and Si is introduced, thus forming the first semiconductor layer 15 (first n-type GaN layer) having the layer thickness of 1400 nm and a Si doping amount of $3 \times 10^{18}$ atoms/cm$^3$.

Subsequently, raw materials of TMA are supplied on the first n-type GaN layer, thus forming the second semiconductor layer 16 (n-type AlGaN layer) having the layer thickness of 10 nm and a Si doping amount of $1 \times 10^{19}$ atoms/cm$^3$ so as to have an Al composition of 20%.

Subsequently, the second n-type GaN layer having the layer thickness of 100 nm and a Si doping amount of $3 \times 10^{18}$ atoms/cm$^3$ is formed on the second semiconductor layer 16. The second n-type GaN layer is formed to reduce a lattice mismatch difference between the second semiconductor layer 16 and a non-doped InGaN layer formed on the second n-type GaN layer.

Subsequently, TMG and trimethyl indium (TMI) are supplied on the second n-type GaN layer, thus forming the non-doped InGaN layer having an In composition of 5%. The non-doped InGaN layer is formed to reduce a distortion of the active layer formed thereon. The InGaN layer may be doped with Si in a range of from $1 \times 10^{17}$ to $1 \times 10^{18}$ atoms/cm$^3$ to be used as a layer for accelerating a carrier injection to the active layer.

Subsequently, stacking a non-doped GaN barrier layer having a layer thickness of 4 nm and a non-doped InGaN well layer having a layer thickness of 3 nm is repeatedly performed five times on the non-doped InGaN layer, and then, a non-doped GaN barrier layer having a layer thickness of 5 nm is stacked, thus forming the active layer.

Then, a Mg doped p-type AlGaN carrier block layer (Al composition ratio 20%) having a layer thickness of 20 nm, a p-type GaN layer, and a p-type GaN contact layer are formed on the active layer in this order, thus ending the semiconductor layer stacking step.

Next, an etching process is performed to the semiconductor layer stacked in Step S102 using a dry etching method (Step S103). Here, the step of performing the etching will be described in detail with reference to FIG. 5 to FIG. 8.

Figure 5:
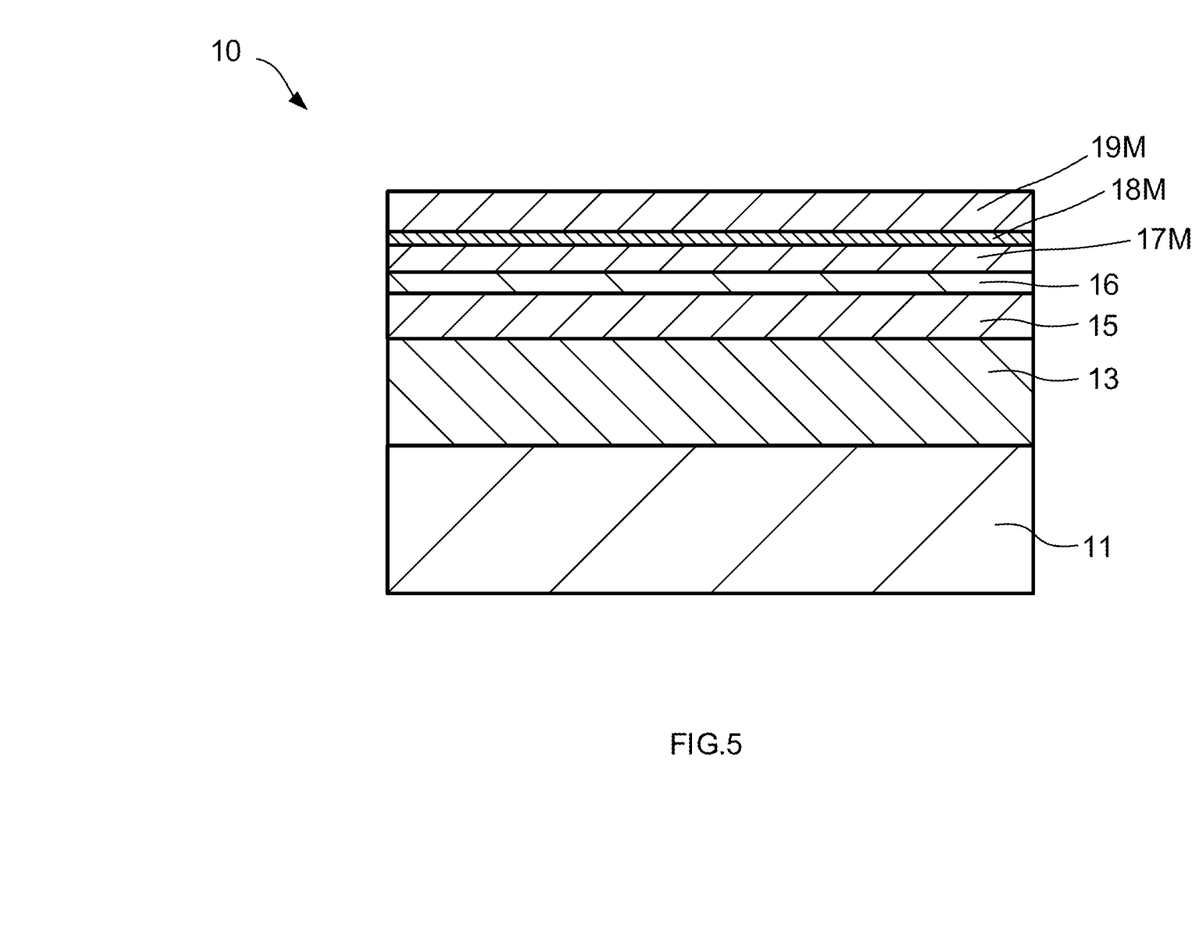
FIG. 5 is a drawing illustrating a part of a manufacturing process of the vertical cavity surface emitting laser according to Embodiment 1.

FIG. 5 is a cross-sectional view of the surface emitting laser 10 in the middle of manufacturing after stacking each of the semiconductor layers above the first multilayer film reflecting mirror 13 in Step S102. In the surface emitting laser 10 in the middle of manufacturing, the first semiconductor layer 15, the second semiconductor layer 16, a second n-type GaN layer 17M, an active layer 18M, and a p-type GaN layer 19M are stacked on the first multilayer film reflecting mirror 13 in this order.

Figure 6:
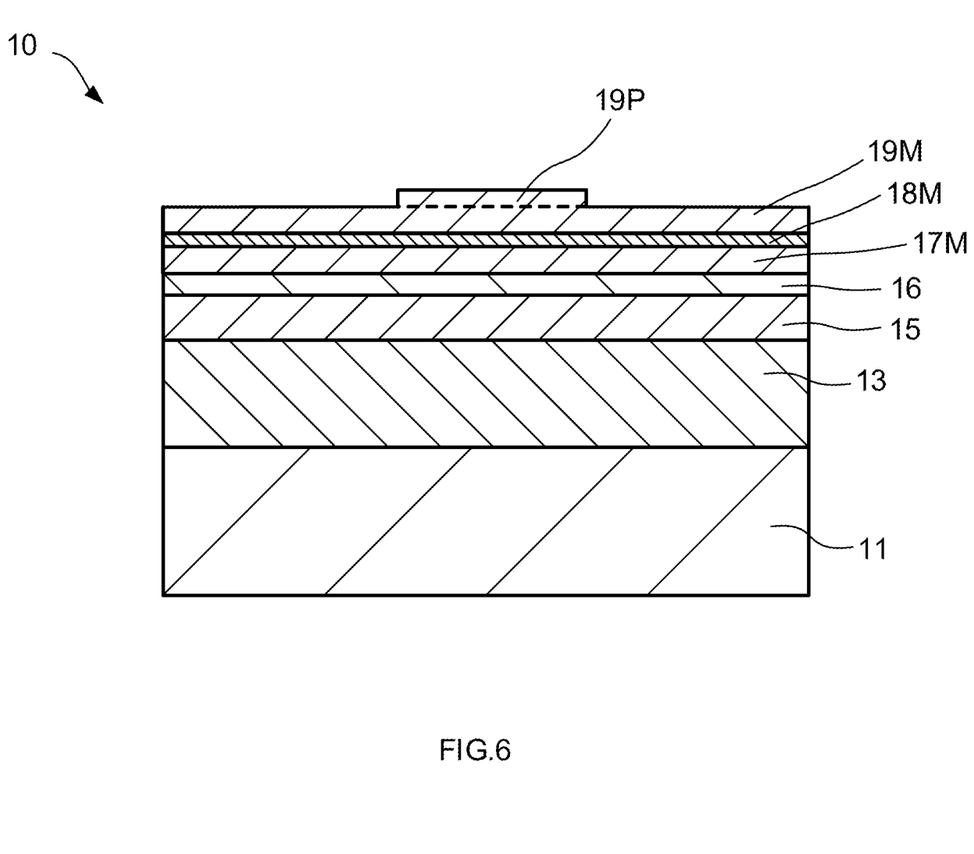
FIG. 6 is a drawing illustrating a part of the manufacturing process of the vertical cavity surface emitting laser according to Embodiment 1.

FIG. 6 is a cross-sectional view of the surface emitting laser 10 in the middle of manufacturing after forming the projecting portion 19P (current confinement layer in this embodiment) in the p-type GaN layer 19M. The projecting portion 19P is formed by removing a part of the p-type GaN layer 19M using a known photolithography technique after Step S102. In this embodiment, the projecting portion 19P is formed by forming a mask of Φ5.5 μm in an approximately center region of a top surface of the p-type GaN layer 19M and performing an etching process on a region excluding the mask formation region using an etching device.

Figure 7:
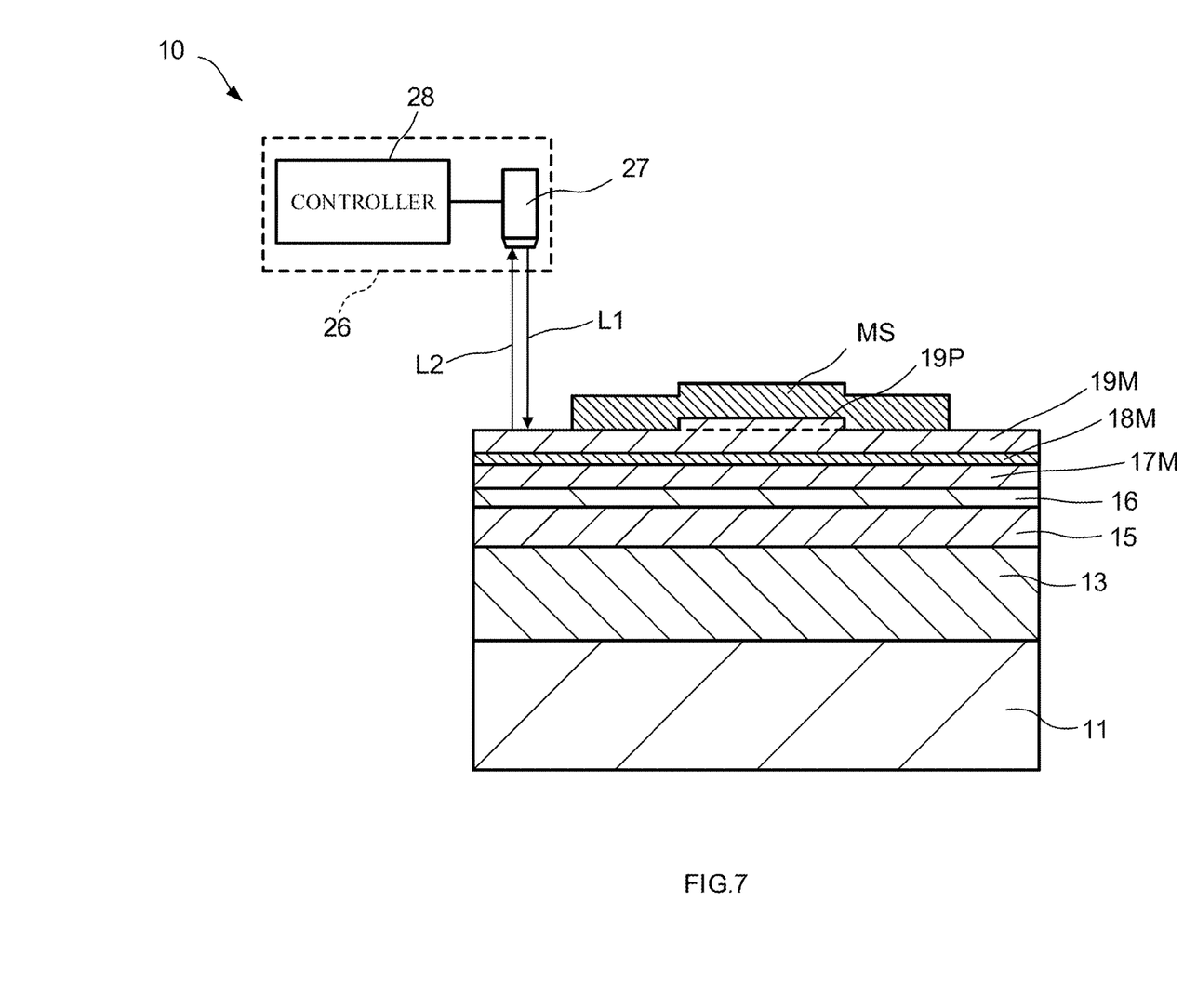
FIG. 7 is a drawing illustrating a part of the manufacturing process of the vertical cavity surface emitting laser according to Embodiment 1.

FIG. 7 is a cross-sectional view of the surface emitting laser 10 in the middle of manufacturing when the etching process on the top surface of the p-type GaN layer 19M is started after forming the projecting portion 19P. As illustrated in FIG. 7, a mask MS is formed on the top surface of the p-type GaN layer 19M. The mask MS is formed by applying a resist over the top surface of the p-type GaN layer 19M, and removing a part of the resist so as to leave a concentric circle having a diameter larger than that of a portion corresponding to the projecting portion 19P.

An end-point detector 26 is a device for detecting a desired etching depth (end point) during the etching process of the semiconductor layer. For example, the end-point detector 26 is incorporated in the etching device. The end-point detector 26 includes a light projecting/receiving unit 27 and a controller 28.

The light projecting/receiving unit 27 is a light projecting/receiving unit including a light projecting unit that emits a laser beam and a light receiving unit that receives a reflected light when an object is irradiated with the laser beam. The controller 28 is connected to the light projecting/receiving unit 27, and controls, for example, a position of the light projecting/receiving unit 27 and an irradiation intensity of the laser beam from the light projecting/receiving unit 27.

By using the light projecting/receiving unit 27 of the end-point detector 26, the etching process is started on the region excluding the region in which the mask MS is formed of the top surface of the p-type GaN layer 19M that is, the region in which the top surface of the p-type GaN layer 19M is exposed while irradiating the region with the laser beam. In FIG. 7, the light emitted from the light projecting/receiving unit 27 toward the top surface of the p-type GaN layer 19M is indicated as a laser beam L1, and a light of a reflection of the laser beam L1 is indicated as a reflected light L2.

Figure 8:
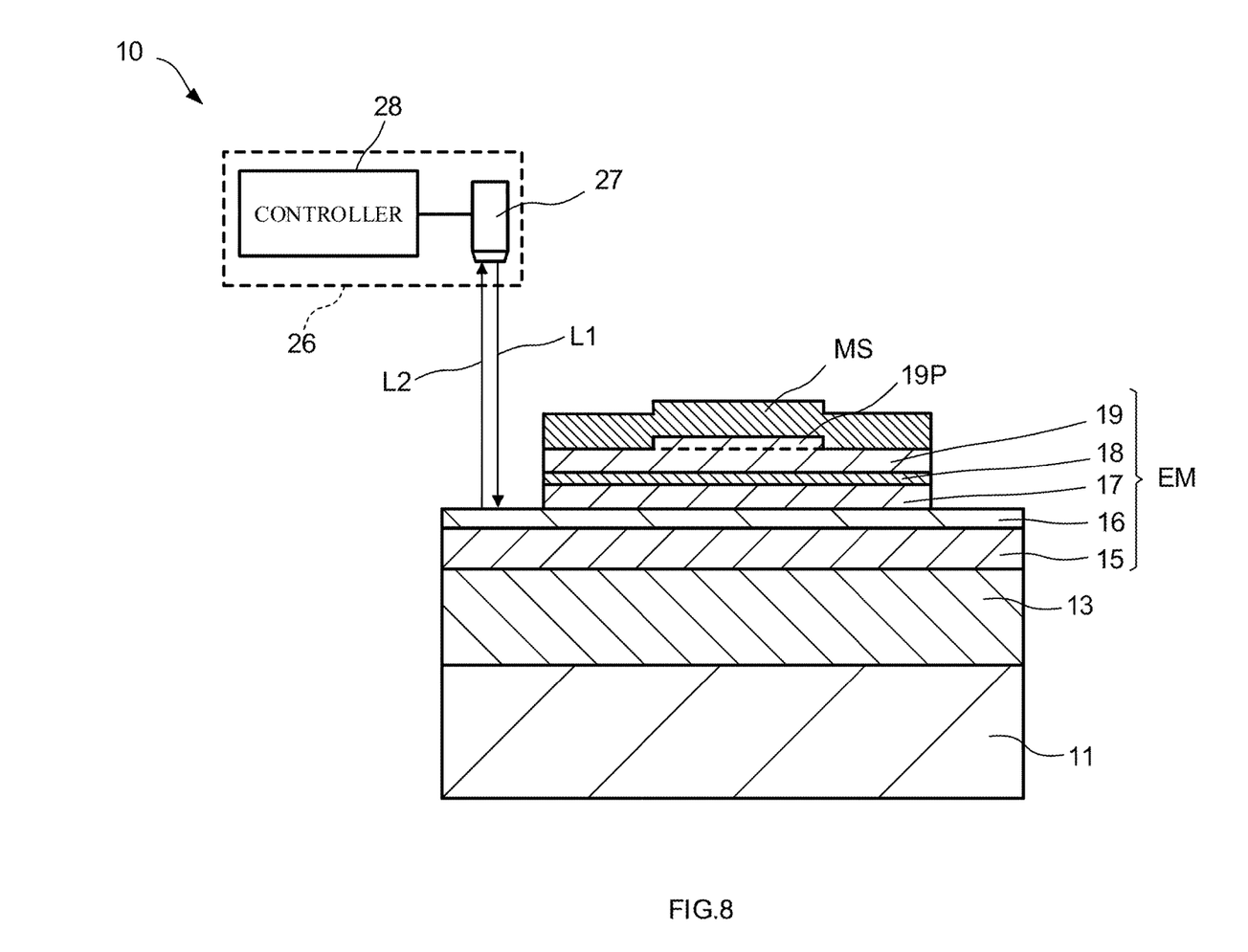
FIG. 8 is a drawing illustrating a part of the manufacturing process of the vertical cavity surface emitting laser according to Embodiment 1.

FIG. 8 is a cross-sectional view of the surface emitting laser 10 in the middle of manufacturing after exposing the region including an outer edge of the top surface of the second semiconductor layer 16 by the etching process. The configuration of the surface emitting laser 10 in the middle of manufacturing illustrated in FIG. 8 is obtained by removing each of the p-type GaN layer 19M, the active layer 18M, and the second n-type GaN layer 17M excluding the region in which the mask is formed while measuring the intensity of the reflected light L2 of the laser beam L1 emitted from the light projecting/receiving unit 27. At this time, the exposure of the second semiconductor layer 16 by the etching process can be determined based on the intensity of the reflected light L2.

Specifically, the second semiconductor layer 16 can be determined to be exposed by detecting a difference between the intensity of the reflected light L2 when the second n-type GaN layer 17M formed on the second semiconductor layer 16 is irradiated with the laser beam L1 and the intensity of the reflected light L2 when the second semiconductor layer 16 is irradiated with the laser beam L1 by using the light projecting/receiving unit 27 of the end-point detector 26.

The mask MS is removed after exposing the second semiconductor layer 16 by the etching process, thereby allowing the formation of the semiconductor structure layer EM having the mesa structure.

Thus, by performing the etching process based on the intensity of the reflected light L2 of the laser beam L1 emitted to the semiconductor layer by using the end-point detector 26, the semiconductor structure layer EM including the second semiconductor layer 16 in which the region including the outer edge of the top surface is exposed and the mesa structure formed on the second semiconductor layer 16 can be formed.

Refer to FIG. 4 again. After Step S103, Ti having a layer thickness of 10 nm and Al having a layer thickness of 500 nm are stacked in this order on the top surface of the second semiconductor layer 16 exposed in Step S103, thus forming the annular n-electrode NE (Step S104).

Next, as a formation step of the insulating layer 21, a dielectric film containing $SiO_2$ is disposed around the projecting portion 19P of the fourth semiconductor layer 19 so as to surround the projecting portion 19P (current confinement layer) of the fourth semiconductor layer 19 formed in Step S103 (Step S105). By Step S105, the top surface of the projecting portion 19P is exposed from the opening 210 of the insulating layer 21.

Next, the translucent electrode layer 23 containing ITO is formed on the projecting portion 19P and the insulating layer 21 so as to cover the top surface of the projecting portion 19P exposed by Step S105 and the top surface of the insulating layer 21 (Step S106).

Next, stacking $Nb_2O_5$ and $SiO_2$ is repeatedly performed ten times on the translucent electrode layer 23 so as to cover the region above the projecting portion 19P in the top surface of the translucent electrode layer 23, thus forming the second multilayer film reflecting mirror 25 containing ten sets of $Nb_2O_5/SiO_2$ (Step S107). At this time, the layers of $Nb_2O_5$ and $SiO_2$ are formed so as to have the respective layer thicknesses of ¼ of an optical layer thickness relative to a desired wavelength.

Next, a layer of Au is formed along an outer edge of the top surface of the translucent electrode layer 23, thereby forming the annular p-electrode PE (Step S108).

At last, an anti-reflection film (not illustrated) is formed on a backside surface (opposite surface of formation surface of first multilayer film reflecting mirror 13) of the substrate 11, thus manufacturing the surface emitting laser 10 illustrated in FIG. 3. The manufacturing process described above is merely an example, the elements doped to the semiconductor, the dimensions of the respective members, and the like can be changed as necessary.

Embodiment 2

Next, a surface emitting laser 20 according to Embodiment 2 will be described by referring to FIG. 9. The surface emitting laser 20 is different from Embodiment 1 in the configuration of the semiconductor structure layer EM, and similar to Embodiment 1 for other configurations.

Figure 9:
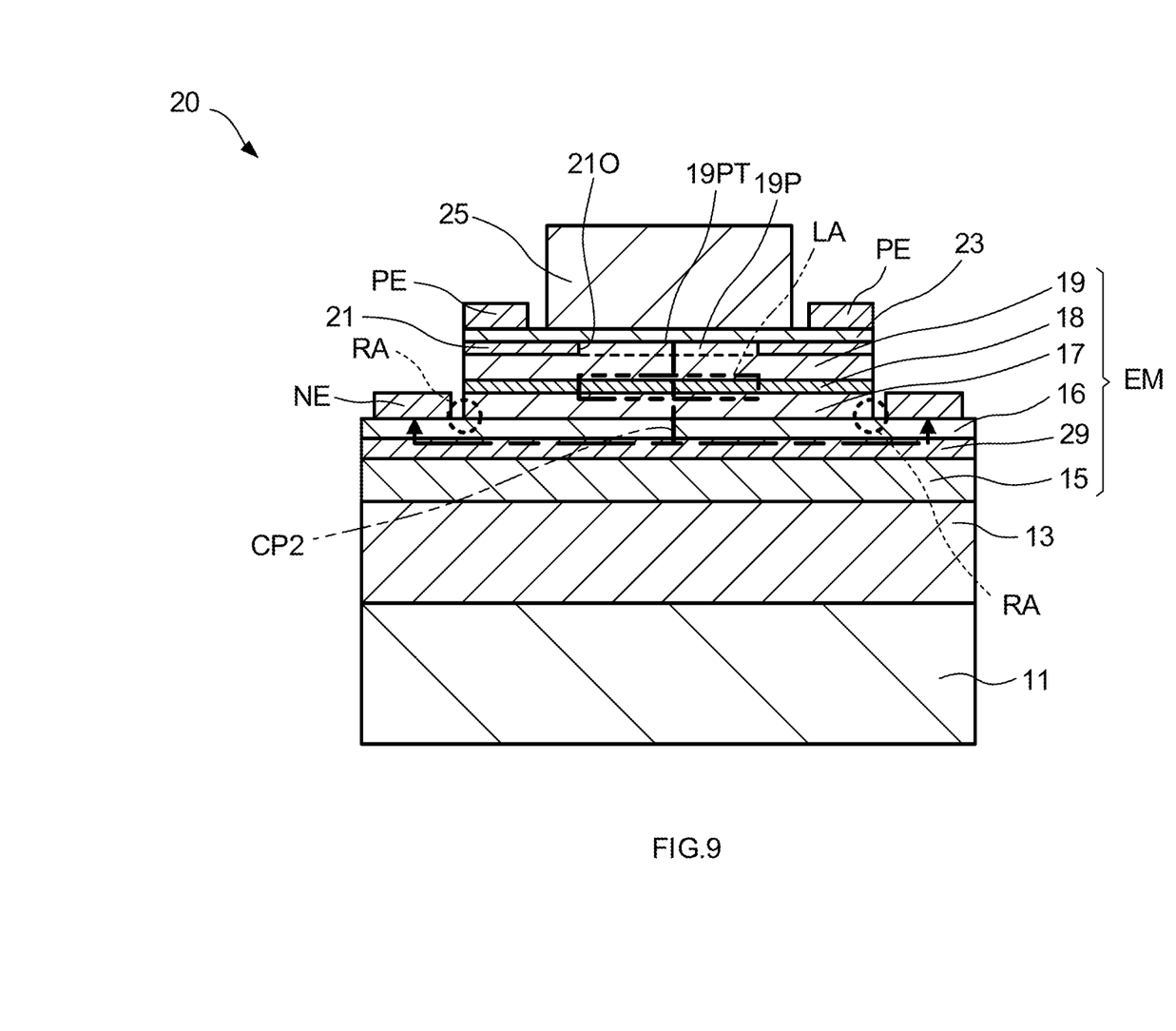
FIG. 9 is a top view of a vertical cavity surface emitting laser according to Embodiment 2.

FIG. 9 is a cross-sectional view of the surface emitting laser 20 taken along the line 3-3 of FIG. 2 similarly to the cross-sectional view illustrated in FIG. 3. A fifth semiconductor layer 29 is a non-doped nitride semiconductor layer formed in contact with the lower surface of the second semiconductor layer 16 containing AlGaN.

The fifth semiconductor layer 29 is formed so as to cover the top surface of the first semiconductor layer 15. Therefore, the fifth semiconductor layer 29 has a top surface shape the same as the top surface shape of the first semiconductor layer 15, that is, a rectangular top surface shape. In this embodiment, the fifth semiconductor layer 29 has a composition of GaN.

In this embodiment, an interface between the non-doped fifth semiconductor layer 29 containing GaN and the second semiconductor layer 16 containing AlGaN is full of the electrons, and the interface has a higher conductivity than other regions.

Specifically, in this embodiment, in a region in the fifth semiconductor layer 29 side in the interface between the fifth semiconductor layer 29 and the second semiconductor layer 16, a state where free electrons having high mobilities in the in-plane direction spread in a layer, that is, a two-dimensional electron gas layer is formed.

In this embodiment, the current that has reached the top surface 19PT of the projecting portion 19P flows through each of the fourth semiconductor layer 19, the active layer 18, the third semiconductor layer 17, and the second semiconductor layer 16 in the thickness direction, and flows to the fifth semiconductor layer 29. The current that has reached the fifth semiconductor layer 29 is dispersed in the in-plane direction in the two-dimensional electron gas layer in the fifth semiconductor layer 29, and flows to the n-electrode NE.

For example, as illustrated as a current path CP2 in FIG. 9, the current that has reached the top surface 19PT of the projecting portion 19P from the p-electrode PE flows to the fifth semiconductor layer 29 passing through the center of each of the fourth semiconductor layer 19, the active layer 18, the third semiconductor layer 17, and the second semiconductor layer 16, and flows to the n-electrode NE passing through the second semiconductor layer 16 again in the thickness direction.

Thus, according to this embodiment, since the current flows along the above-described path, a behavior of the current passing through the shortest path from the top surface 19PT to the n-electrode NE, for example, a path in which the current flows from the top surface 19PT and concentrates to the region RA in the proximity of the lower end of the third semiconductor layer 17 is avoided. In other words, this embodiment allows avoiding the concentration of the current to the proximity of the rising portion of the mesa structure. Therefore, this embodiment allows avoiding an element breakdown and the like caused by the current concentration to the region RA.

In this embodiment, the current flowing from the top surface 19PT flows a region LA (region in which the current contributes to the gain of the laser beam) immediately below the projecting portion 19P of the fourth semiconductor layer 19 in the active layer 18 in the thickness direction similarly to Embodiment 1.

Therefore, this embodiment allows avoiding a flow of the current to, for example, a region not contributing to the gain of the laser beam around the region LA, that is, a region in which an optical loss occurs. Therefore, since this embodiment allows avoiding the unnecessary flow of the current to the region in which an optical loss occurs, a threshold current necessary for oscillating the laser beam can be reduced.

Thus, according to this embodiment, similarly to Embodiment 1, in the semiconductor structure layer EM of the surface emitting laser 10, the threshold current necessary for oscillating the laser beam can be reduced while the current flows the region contributing to the gain of the laser beam in the semiconductor layer.

The fifth semiconductor layer 29 preferably has a layer thickness of from 10 to 50 nm from an aspect of generating a two-dimensional electron gas between the second semiconductor layer 16 and the fifth semiconductor layer 29. That is, the fifth semiconductor layer 29 has the thinner layer thickness than the first semiconductor layer 15.

In this embodiment, to configure the fifth semiconductor layer 29 as a path to disperse the current in the in-plane direction, the first semiconductor layer formed under the fifth semiconductor layer 29 may have a concentration of doped Si different from that of Embodiment 1. For example, the concentration of Si doped to the first semiconductor layer may be in a range of from $5 \times 10^{17}$ to $3 \times 10^{18}$ atoms/cm$^3$ as a concentration not causing an unstable operating voltage.

Various numerical values, dimensions, materials, and the like in the embodiments and the modifications described above are merely examples, and can be appropriately selected depending on the usage and the surface emitting laser to be manufactured. For example, while the vertical cavity surface emitting laser is described in the embodiment, the application target of the configuration of the present invention is not limited to the surface emitting laser, and the configuration of the present invention is also applicable to other vertical cavity-type light-emitting devices, such as a vertical cavity light-emitting diode.

In the embodiments and the modifications, ordinal numerals such as "first" and "second" are used for convenience, and do not indicate the stacking order of the members in some cases. Therefore, for example, the description may be given by replacing "first" with "second" as necessary.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. The present application is based upon and claims the benefit of priority from the prior Japanese Patent Application No. 2021-94869 filed on Jun. 7, 2021, the entire contents of which are incorporated herein by reference.

What is claimed is:

1. A vertical cavity light-emitting element comprising:
    a substrate;
    a first multilayer film reflecting mirror formed on the substrate;
    a semiconductor structure layer that includes a nitride semiconductor, the nitride semiconductor including a first semiconductor layer that is formed on the first multilayer film reflecting mirror and is a first conductivity type, a second semiconductor layer that is formed on the first semiconductor layer and is the first conductivity type, a light-emitting layer that is formed on the second semiconductor layer and is configured to expose a region including an outer edge of a top surface of the second semiconductor layer, and a third semiconductor layer that is formed on the light-emitting layer and is a second conductivity type opposite to the first conductivity type;
    an electrode formed on the top surface of the second semiconductor layer;
    an electrode layer electrically in contact with the third semiconductor layer in one region of a top surface of the third semiconductor layer; and
    a second multilayer film reflecting mirror constituting a resonator with the first multilayer film reflecting mirror, wherein
    the light-emitting layer has a quantum well structure including a well layer and a barrier layer,
    the first semiconductor layer has a composition of GaN,
    the second semiconductor layer has a composition of AlGaN, a thickness of the second semiconductor layer being thinner than a thickness of the first semiconductor layer, and a resistance of the second semiconductor layer being larger than a resistance of the first semiconductor layer.

2. A manufacturing method of the vertical cavity light-emitting element according to claim 1, the method comprising:
    a first multilayer film reflecting mirror forming step of forming the first multilayer film reflecting mirror on the substrate;
    a semiconductor layer stacking step of stacking a GaN layer of the first conductivity type, an AlGaN layer of the first conductivity type, the light-emitting layer, and a nitride semiconductor layer of the second conductivity type opposite to the first conductivity type on the first multilayer film reflecting mirror in this order;
    an etching process step of forming a mask in one region of a top surface of the nitride semiconductor layer and exposing a region including an outer edge of a top surface of the AlGaN layer by performing an etching process on another region excluding the one region of the top surface by a dry etching method while measuring an intensity of a reflected light when the other region is irradiated with a laser beam, the etching process step stopping the etching process based on a change of the intensity of the reflected light;

an electrode forming step of forming an electrode on the top surface of the AlGaN layer;

an electrode layer forming step of forming the electrode layer electrically in contact with the nitride semiconductor layer in the one region of the top surface of the nitride semiconductor layer; and a second multilayer film reflecting mirror forming step of forming the second multilayer film reflecting mirror constituting a resonator with the first multilayer film reflecting mirror.

3. The vertical cavity light-emitting element according to claim 1, wherein:

the well layer has a composition of InGaN, the barrier layer has a composition of GaN, and the third semiconductor layer has a composition of GaN.

4. The vertical cavity light-emitting element according to claim 1, wherein the thickness of the second semiconductor layer is 7 nm or more and 20 nm or less.

5. The vertical cavity light-emitting element according to claim 1, wherein the thickness of the first semiconductor layer is ten times or more the thickness of the second semiconductor layer.

6. The vertical cavity light-emitting element according to claim 4, wherein the thickness of the first semiconductor layer is 500 nm or more and 1,600 nm or less.

7. The vertical cavity light-emitting element according to claim 1, wherein an Al content of the second semiconductor layer is 8% or more and 35% or less.

8. The vertical cavity light-emitting element according to claim 1, wherein, in a case in which m is any given integer, $\lambda$ is an oscillation wavelength of a laser beam, and n is a GaN refractive index at the oscillation wavelength, a distance a between a center of the second semiconductor layer in a thickness direction and a center of the light-emitting layer in a thickness direction is expressed as $a=(2m+1)\times 0.25\lambda/n$.

9. A vertical cavity light-emitting element, comprising:

a substrate;

a first multilayer film reflecting mirror formed on the substrate;

a semiconductor structure layer that includes a nitride semiconductor, the nitride semiconductor including a first semiconductor layer that is formed on the first multilayer film reflecting mirror and is a first conductivity type, a second semiconductor layer that is formed on the first semiconductor layer and is the first conductivity type, a light-emitting layer that is formed on the second semiconductor layer and is configured to expose a region including an outer edge of a top surface of the second semiconductor layer, and a third semiconductor layer that is formed on the light-emitting layer and is a second conductivity type opposite to the first conductivity type;

an electrode formed on the top surface of the second semiconductor layer;

an electrode layer electrically in contact with the third semiconductor layer in one region of a top surface of the third semiconductor layer;

a second multilayer film reflecting mirror constituting a resonator with the first multilayer film reflecting mirror; and a fourth semiconductor layer formed in contact with a lower surface of the second semiconductor layer, the fourth semiconductor layer being non-doped and having a composition of GaN, wherein the first semiconductor layer has a composition of GaN, and the second semiconductor layer has a composition of AlGaN, a resistance of the second semiconductor layer being larger than a resistance of the first semiconductor layer.

* * * * *